US010777435B2

(12) United States Patent
Matsuura

(10) Patent No.: US 10,777,435 B2
(45) Date of Patent: Sep. 15, 2020

(54) SUBSTRATRE DELIVERY METHOD AND SUBSTRATE PROCESSING APPARATUS

(71) Applicant: TOKYO ELECTRON LIMITED, Tokyo (JP)

(72) Inventor: Shin Matsuura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 281 days.

(21) Appl. No.: 15/997,817

(22) Filed: Jun. 5, 2018

(65) Prior Publication Data
US 2018/0350644 A1 Dec. 6, 2018

(30) Foreign Application Priority Data

Jun. 6, 2017 (JP) .................................. 2017-111747

(51) Int. Cl.
*H01L 21/68* (2006.01)
*H01L 21/67* (2006.01)
(Continued)

(52) U.S. Cl.
CPC .... *H01L 21/67259* (2013.01); *H01L 21/3065* (2013.01); *H01L 21/67309* (2013.01);
(Continued)

(58) Field of Classification Search
CPC ......... H01L 21/67259; H01L 21/68742; H01L 21/3065; H01L 21/67309; H01L 21/68; H01L 21/683
See application file for complete search history.

(56) References Cited

U.S. PATENT DOCUMENTS 4,955,590 A * 9/1990 Narushima ........... B25B 11/005
269/21
5,065,495 A * 11/1991 Narushima ........... B25B 11/005
269/21
(Continued)

FOREIGN PATENT DOCUMENTS

JP 2006-278819 A 10/2006
JP 2011-54933 A 3/2011

OTHER PUBLICATIONS

Y. Chen, Y. Lee, J. Lee and J. Chen, "Implementation of a wafer positioning system," SICE Annual Conference 2011, Tokyo, 2011, pp. 1938-1943. (Year: 2011).*

*Primary Examiner* — Michael D Masinick
(74) *Attorney, Agent, or Firm* — Rothwell, Figg, Ernst & Manbeck, P.C.

(57) ABSTRACT

A substrate delivery method includes receiving a substrate by protruding a plurality of pins, detecting a position of a predetermined portion of the substrate in a state where the substrate is supported by the plurality of pins, estimating a deviation amount and a deviation direction of a positional deviation between a center position of the substrate and a predetermined reference position using a detected result, tilting the substrate, and bringing the substrate into partial contact with the placing table by lowering the plurality of pins at a same speed in a state where the substrate is tilted, and disposing the substrate on the placing table while moving the center position of the substrate by the deviation amount in a direction opposite to the deviation direction by using rotation of the substrate in a vertical direction due to contact with the placing table by continuously lowering the plurality of pins.

4 Claims, 6 Drawing Sheets

(51) Int. Cl.
*H01L 21/3065* (2006.01)
*H01L 21/673* (2006.01)
*H01L 21/683* (2006.01)
*H01L 21/687* (2006.01)

(52) U.S. Cl.
CPC ............ *H01L 21/68* (2013.01); *H01L 21/683* (2013.01); *H01L 21/68742* (2013.01)

(56) References Cited

U.S. PATENT DOCUMENTS

| | | | | |
|---|---|---|---|---|
| 9,496,159 | B2* | 11/2016 | Genetti | H01L 21/67196 |
| 9,929,005 | B1* | 3/2018 | Shimamoto | C23C 16/401 |
| 2004/0047720 | A1* | 3/2004 | Lerner | H01L 21/68 |
| | | | | 414/781 |
| 2006/0005770 | A1* | 1/2006 | Tiner | C23C 16/4586 |
| | | | | 118/728 |
| 2009/0027657 | A1* | 1/2009 | Serebryanov | H01L 21/681 |
| | | | | 356/73 |
| 2010/0264132 | A1* | 10/2010 | Koelmel | H01L 21/68 |
| | | | | 219/647 |
| 2015/0371875 | A1* | 12/2015 | Sasaki | C23C 16/4405 |
| | | | | 15/316.1 |
| 2017/0183775 | A1* | 6/2017 | Yamamoto | C23C 16/345 |

\* cited by examiner

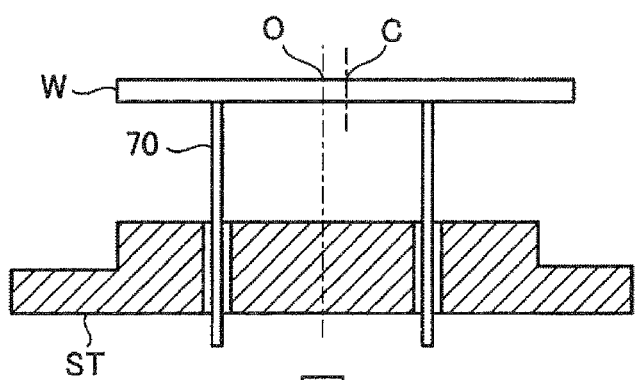
FIG. 4A
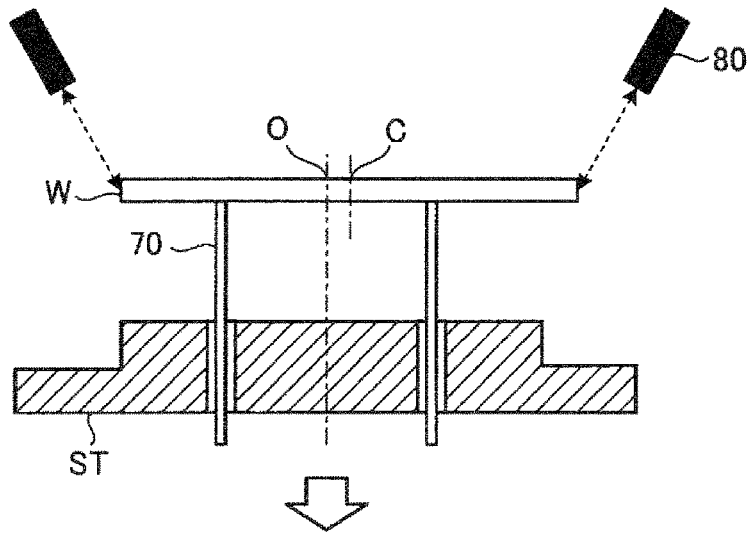
FIG. 4B
FIG. 4C
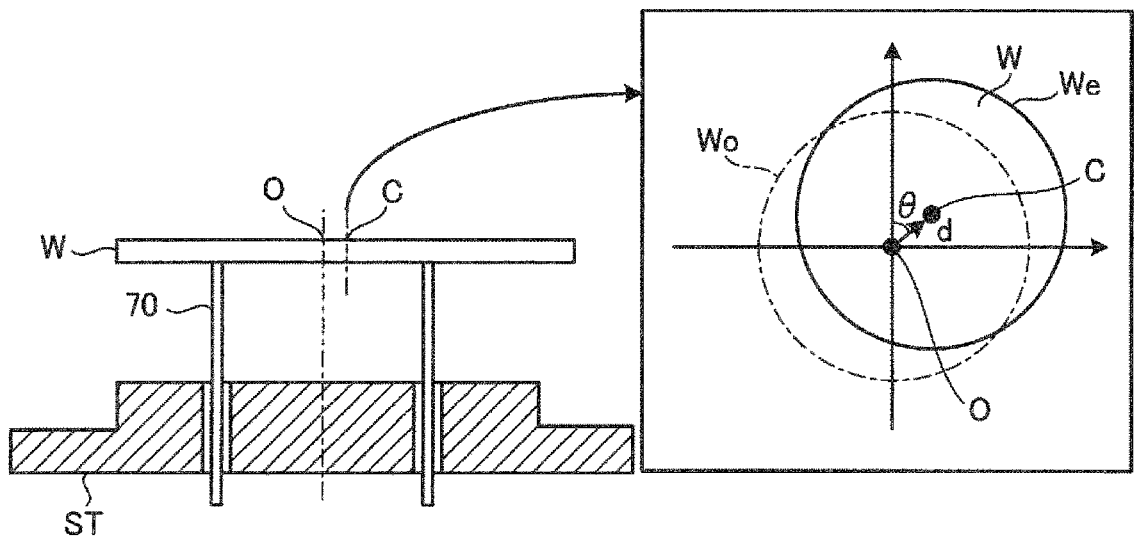

FIG. 5

| COMBINATION OF DEVIATION AMOUNT "d" AND DEVIATION DIRECTION "θ" | HEIGHT POSITION OF EACH PIN |
|---|---|
| (d, θ)=(d1, θ1) | (PIN#1, PIN#2, PIN#3)=(H1,H2,H3) |
| (d, θ)=(d2, θ2) | (PIN#1, PIN#2, PIN#3)=(H4,H5,H6) |
| ⋮ | ⋮ |

SUBSTRATRE DELIVERY METHOD AND SUBSTRATE PROCESSING APPARATUS

CROSS-REFERENCE TO RELATED APPLICATIONS

This application is based on and claims priority from Japanese Patent Application No. 2017-111747 filed on Jun. 6, 2017, with the Japan Patent Office, the disclosures of which are incorporated herein in their entirety by reference.

TECHNICAL FIELD

Various aspects and exemplary embodiments of the present disclosure relate to a substrate delivery method and a substrate processing apparatus.

BACKGROUND

For example, in a substrate processing apparatus that performs a substrate processing such as, for example, etching or film formation, a plurality of pins are provided on a placing table, on which a substrate such as, for example, a semiconductor wafer is disposed to protrude from or retreat to a placing surface of the placing table. Then, when a substrate transported by a transport arm is delivered to the placing table, the substrate is received from the transport arm by the plurality of pins protruding from the placing table. As the plurality of pins are lowered in a state where the substrate is supported by the plurality of pins, the substrate is placed on the placing table.

Here, there is a technique of performing positioning of a substrate using an alignment device so that a center position of the substrate coincides with a predetermined reference position before the substrate is transported to the placing table by the transport arm. See, for example, Japanese Patent Laid-Open Publication Nos. 2011-054933 and 2006-278819.

SUMMARY

A substrate delivery method disclosed in one exemplary embodiment includes receiving a substrate from a transport device by protruding a plurality of pins, which are provided to freely protrude from or retreat to a placing table, on which the substrate transported by the transport device is disposed, detecting a position of a predetermined portion of the substrate in a state where the substrate is supported by the plurality of pins, estimating a deviation amount and a deviation direction of a positional deviation between a center position of the substrate and a predetermined reference position using a detected result of the position of the predetermined portion of the substrate, tilting the substrate by individually moving each pin to a height position of the pin depending on the estimated deviation amount and deviation direction, and bringing the substrate into partial contact with the placing table by lowering the plurality of pins at a same speed in a state where the substrate is tilted, and disposing the substrate on the placing table while moving the center position of the substrate by the deviation amount in a direction opposite to the deviation direction by using rotation of the substrate in a vertical direction due to contact with the placing table by continuously lowering the plurality of pins.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A to 4C are views for explaining an example of a flow of a substrate delivery processing according to an exemplary embodiment.

FIG. 5 is a view illustrating an example of a height position table.

DETAILED DESCRIPTION

Figure 1:
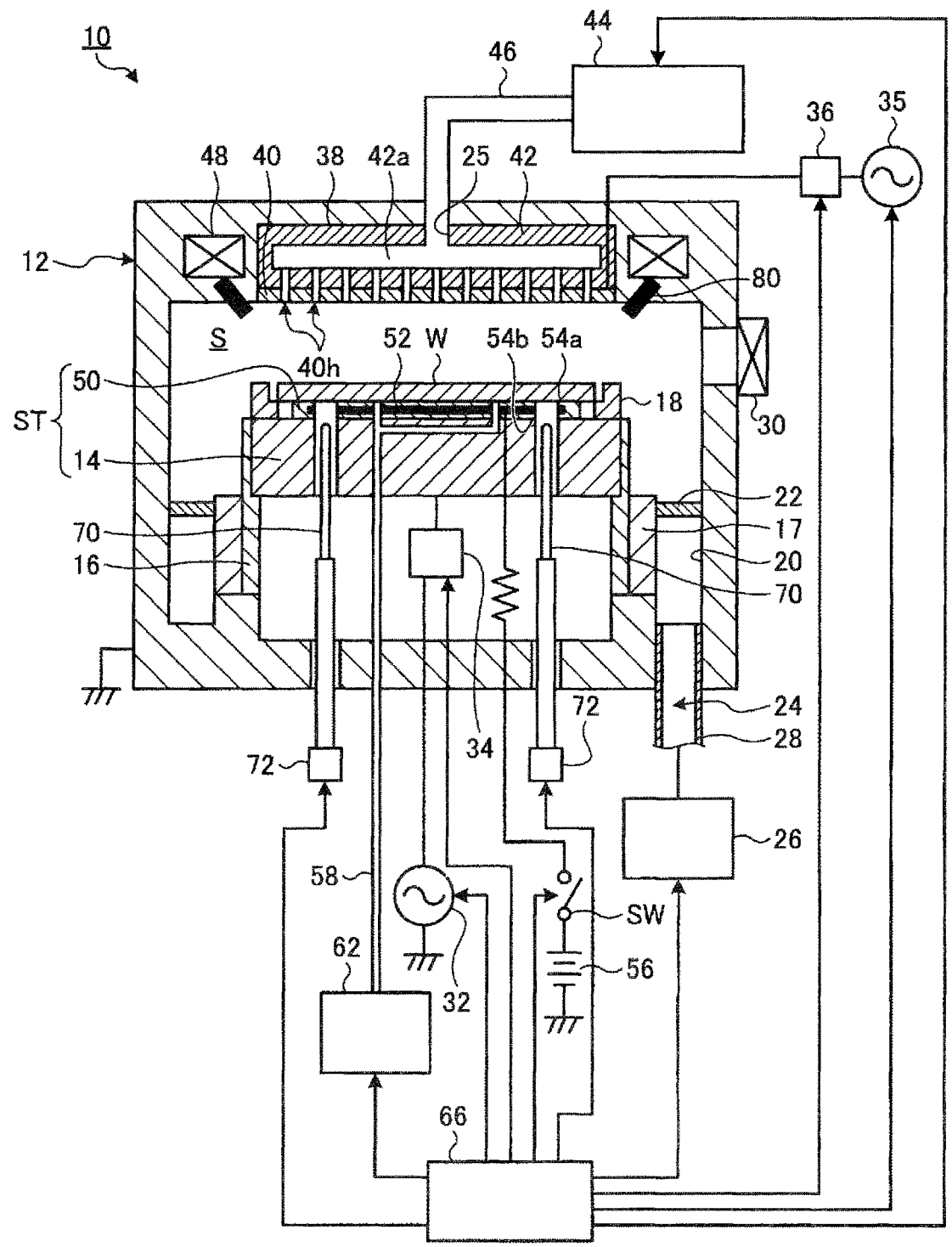
FIG. 1 is a view schematically illustrating a substrate processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

However, when the positioned substrate is transported to the placing table by the transport arm, the center position of the substrate may deviate from the predetermined reference position due to a vibration of the transport arm. As a result, in a case where the plurality of pins, which have received the substrate from the transport arm, are lowered to dispose the substrate on the placing table, a positional deviation of the center position of the substrate may remain. Therefore, it is expected to appropriately correct the positional deviation of the center position of the substrate disposed on the placing table.

A substrate delivery method disclosed in one exemplary embodiment includes receiving a substrate from a transport device by protruding a plurality of pins, which are provided to freely protrude from or retreat to a placing table, on which the substrate transported by the transport device is disposed, detecting a position of a predetermined portion of the substrate in a state where the substrate is supported by the plurality of pins, estimating a deviation amount and a deviation direction of a positional deviation between a center position of the substrate and a predetermined reference position by using a detected result of the position of the predetermined portion of the substrate, tilting the substrate by individually moving each pin to a height position of the pin depending on the estimated deviation amount and deviation direction, and bringing the substrate into partial contact with the placing table by lowering the plurality of pins at a same speed in a state where the substrate is tilted, and disposing the substrate on the placing table while moving the center position of the substrate by the deviation amount in a direction opposite to the deviation direction by using rotation of the substrate in a vertical direction due to contact with the placing table by continuously lowering the plurality of pins.

In the above-described substrate delivery method, the tilting includes selecting the height position of each pin corresponding to a combination of the estimated deviation amount and deviation direction with reference to a table in which the height position of each pin for tilting the substrate is stored to be associated with each combination of the deviation amount and the deviation direction of the positional deviation between the center position of the substrate and the predetermined reference position, and individually moving each pin to the selected height position so as to tilt the substrate.

In the above-described substrate delivery method, the tilting includes individually moving each pin so as to tilt the substrate in a state where a portion of an edge portion of the substrate, which intersects a straight line that extends from the reference position and passes through the center position of the substrate, becomes lowest.

A substrate processing apparatus in one exemplary embodiment includes: a processing container; a placing table provided in the processing container, on which a substrate transported by a transport device is disposed; a plurality of pins provided to freely protrude from or retreat to the placing table; a detector configured to detect a position of a predetermined portion of the substrate; and a control unit configured to execute the above-described substrate delivery method.

According to one aspect of the disclosed substrate delivery method, it is possible to appropriately correct a positional deviation of the center position of the substrate disposed on the placing table.

Hereinafter, exemplary embodiments of a substrate delivery method and a substrate processing apparatus disclosed herein will be described in detail with reference to the drawings. In addition, in the respective drawings, the same reference numerals will be given to the same or corresponding parts.

FIG. 1 is a view schematically illustrating a substrate processing apparatus according to an exemplary embodiment. In FIG. 1, a cross section of the substrate processing apparatus according to the exemplary embodiment is illustrated.

As illustrated in FIG. 1, the substrate processing apparatus 10 of the exemplary embodiment is a parallel flat plate type plasma processing apparatus. The substrate processing apparatus 10 includes a processing container 12. The processing container 12 has a substantially cylindrical shape, and defines a processing space S as an internal space thereof. The substrate processing apparatus 10 includes a stage ST in the processing container 12. The stage ST is a placing table on which a semiconductor wafer (hereinafter referred to as "wafer") W as a processing target substrate is disposed. The wafer W is transported toward the stage ST by a transport device such as, for example, a transport arm (not illustrated). In the exemplary embodiment, the stage ST includes a susceptor 14 and an electrostatic chuck 50. The susceptor 14 has a substantially disk shape, and is provided below the processing space S. The susceptor 14 is formed of aluminum, for example, and constitutes a lower electrode.

In the exemplary embodiment, the substrate processing apparatus 10 further includes a cylindrical holding unit 16 and a cylindrical support unit 17. The cylindrical holding unit 16 is in contact with edge portions of the side surface and the bottom surface of the susceptor 14 to hold the susceptor 14. The cylindrical support unit 17 extends in a vertical direction from the bottom portion of the processing container 12, and supports the susceptor 14 via the cylindrical holding unit 16.

The substrate processing apparatus 10 further includes a focus ring 18. The focus ring 18 is disposed on the upper surface of a peripheral edge portion of the susceptor 14. The focus ring 18 is a member for improving in-plane uniformity of the processing accuracy of the wafer W. The focus ring 18 is a plate-shaped member having a substantially annular shape, and is formed of, for example, silicon, quartz, or silicon carbide.

In the exemplary embodiment, an exhaust path 20 is formed between the sidewall of the processing container 12 and the cylindrical support unit 17. A baffle plate 22 is attached to the inlet of the exhaust path 20 or in the middle thereof. In addition, an exhaust port 24 is provided in the bottom portion of the exhaust path 20. The exhaust port 24 is defined by an exhaust pipe 28 fitted in the bottom portion of the processing container 12. An exhaust device 26 is connected to the exhaust pipe 28. The exhaust device 26 includes a vacuum pump, and is capable of reducing the processing space S in the processing container 12 to a predetermined degree of vacuum. A gate valve 30 is attached to the sidewall of the processing container 12 to open and close a carry-in/out opening of the wafer W.

A high-frequency power supply 32 for plasma generation is electrically connected to the susceptor 14 via a matcher 34. The high-frequency power supply 32 applies high-frequency power of a predetermined high frequency (e.g., 13 MHz) to the lower electrode, that is, the susceptor 14.

The substrate processing apparatus 10 further includes a shower head 38 in the processing container 12. The shower head 38 is provided above the processing space S. The shower head 38 includes an electrode plate 40 and an electrode support body 42.

The electrode plate 40 is a conductive plate having a substantially disk shape, and constitutes an upper electrode. A high-frequency power supply 35 for plasma generation is electrically connected to the electrode plate 40 via a matcher 36. The high-frequency power supply 35 applies high frequency power of a predetermined high frequency (e.g., 60 MHz) to the electrode plate 40. When high frequency power is applied to the susceptor 14 and the electrode plate 40 by the high-frequency power supply 32 and the high-frequency power supply 35, respectively, a high-frequency electric field is formed in the space between the susceptor 14 and the electrode plate 40, that is, in the processing space S.

A plurality of gas vent holes 40$h$ are formed in the electrode plate 40. The electrode plate 40 is detachably supported by the electrode support body 42. A buffer chamber 42$a$ is provided inside the electrode support body 42. The substrate processing apparatus 10 further includes a gas supply unit 44, and the gas supply unit 44 is connected to a gas intake port 25 of the buffer chamber 42$a$ through a gas supply conduit 46. The gas supply unit 44 supplies a processing gas to the processing space S. The processing gas may be, for example, a processing gas for etching or a processing gas for film formation. The electrode support body 42 is formed with a plurality of holes, each continuing to a corresponding one of the plurality of gas vent holes 40$h$, and the plurality of holes communicate with the buffer chamber 42$a$. The gas supplied from the gas supply unit 44 is supplied to the processing space S by way of the buffer chamber 42$a$ and the gas vent holes 40$h$.

In the exemplary embodiment, a magnetic-field forming mechanism 48 is provided on the ceiling portion of the processing container 12 so as to extend annularly or concentrically. The magnetic-field forming mechanism 48 functions to facilitate the start of high-frequency discharge (plasma ignition) in the processing space S and stably maintain the discharge.

In addition, a detector 80 is provided on the ceiling portion of the processing container 12 to detect the position of an edge portion of the wafer W supported by a plurality of pins 70 to be described later. The detector 80 includes a light emitting element and a light receiving element (not illustrated). The detector 80 emits a laser light generated from the light emitting element to the edge portion of the wafer W, receives the reflected light of the laser light emitted to the edge portion of the wafer W, and detects the position of the edge portion of the wafer W based on the amount of the received reflected light. The detection result of the detector 80 is output to a control unit 66 to be described later. In addition, the installation position of the detector 80 is not limited to the ceiling portion of the processing container 12, but may be the sidewall portion of the processing container 12 or the inside of the stage ST.

In the substrate processing apparatus 10, the electrostatic chuck 50 is provided on the upper surface of the susceptor 14. The electrostatic chuck 50 includes a pair of insulating films 54a and 54b and an electrode 52 sandwiched between the pair of insulating films 54a and 54b. A DC power supply 56 is connected to the electrode 52 via a switch SW. When a DC voltage is applied from the DC power supply 56 to the electrode 52, a Coulomb force is generated, and the wafer W is suctioned by and held on the electrostatic chuck 50 by the Coulomb force.

In the exemplary embodiment, the substrate processing apparatus 10 further includes a gas supply line 58 and a heat transfer gas supply unit 62. The heat transfer gas supply unit 62 is connected to the gas supply line 58. The gas supply line 58 extends to the upper surface of the electrostatic chuck 50, and extends annularly on the upper surface. The heat transfer gas supply unit 62 supplies a heat transfer gas such as, for example, He gas to the space between the upper surface of the electrostatic chuck 50 and the wafer W.

(Configuration of Stage ST)

Figure 2:
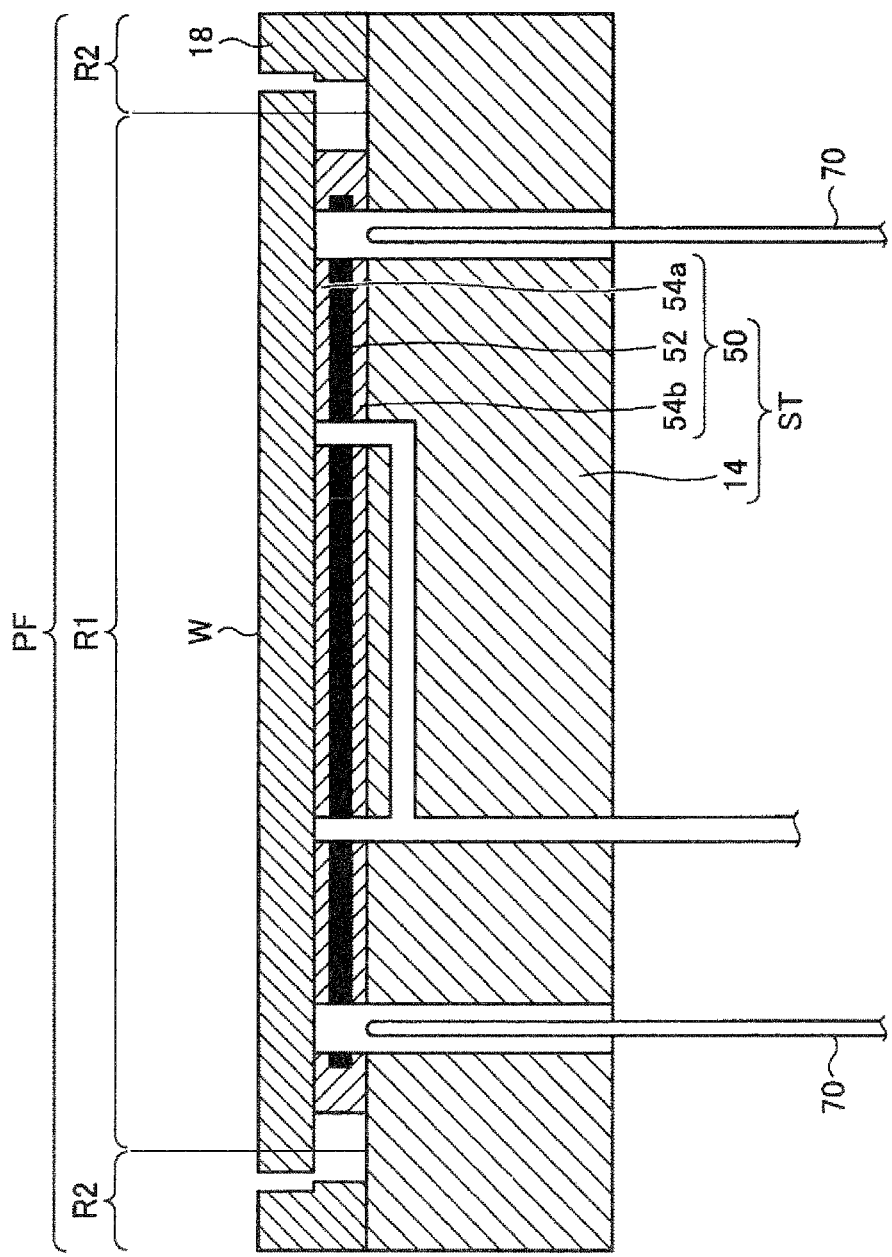
FIG. 2 is an enlarged cross-sectional view of a stage ST of the substrate processing apparatus illustrated in FIG. 1.

FIG. 2 is an enlarged cross-sectional view of the stage ST of the substrate processing apparatus illustrated in FIG. 1. As illustrated in FIG. 2, the stage ST has a placing surface PF. The placing surface PF includes a first region R1 and a second region R2. The first region R1 is a region for placing the wafer W. In the exemplary embodiment, the first region R1 is defined by the upper surface of the electrostatic chuck 50 and is a substantially circular region. The first region R1 is an example of the placing surface of the stage ST. The second region R2 is a region for placing the focus ring 18, and is provided annularly so as to surround the first region R1. In the exemplary embodiment, the second region R2 is defined by the upper surface of a peripheral edge portion of the susceptor 14.

The stage ST is provided with the plurality of pins 70 so as to protrude from or retreat to the placing surface of the stage ST (i.e., the first region R1). The plurality of pins 70 are provided, for example, in a plurality of holes, which are equidistantly formed in the circumferential direction in the stage ST, via seal members such as O-rings. In the exemplary embodiment, three holes are equidistantly formed in the circumferential direction, and three pins 70 are provided in the three holes.

The plurality of pins 70 are independently connected to a plurality of drive units 72 (see FIG. 1), and are driven up and down by the plurality of drive units 72, respectively. For example, each drive unit 72 includes a motor and a ball screw, and converts rotational motion of the motor into linear motion by the ball screw, thereby raising or lowering each pin 70. Then, when the wafer W is delivered between the stage ST and the transport arm, which transports the wafer W to the stage ST, the plurality of pins 70 are raised or lowered to temporarily support the wafer W above the stage ST.

In addition, a plurality of measuring devices (not illustrated) such as, for example, encoders are provided on the plurality of drive units 72, and the plurality of measuring devices measure height positions of the plurality of pins 70, respectively. Here, the height positions of the plurality of pins 70 are positions of tip ends of the plurality of pins 70 on the basis of the placing surface of the stage ST or a reference plane that is spaced apart downward from the placing by a predetermined distance.

Returning to the description of FIG. 1, in the exemplary embodiment, the substrate processing apparatus 10 further includes the control unit 66. The control unit 66 totally controls an operation of the substrate processing apparatus 10. The control unit 66 is provided with a controller including a CPU, a user interface, and a storage unit. The user interface includes, for example, a keyboard, by which a process manager inputs commands in order to manage the substrate processing apparatus 10, and a display, which visualizes and displays the operational status of the substrate processing apparatus 10.

The storage unit stores recipes in which, for example, control programs (software) or processing condition data for realizing various processings executed by the plasma processing apparatus under the control of the controller are stored. Then, if necessary, a desired processing is performed by the substrate processing apparatus 10 under the control of the controller by calling an arbitrary recipe from the storage unit by, for example, an instruction from the user interface and causing the controller to execute the recipe. In addition, the recipes such as, for example, the control programs or the processing condition data may be stored in a computer-readable computer recording medium (e.g., a hard disk, CD, flexible disk, or semiconductor memory), or may be frequently transmitted and used in on-line via, for example, a dedicated line from other apparatuses.

The control unit 66 is connected to the exhaust device 26, the switch SW, the high-frequency power supply 32, the matcher 34, the high-frequency power supply 35, the matcher 36, the gas supply unit 44, and the heat transfer gas supply unit 62. The control unit 66 sends control signals to the exhaust device 26, the switch SW, the high-frequency power supply 32, the matcher 34, the high-frequency power supply 35, the matcher 36, the gas supply unit 44, and the heat transfer gas supply unit 62, respectively. Based on the control signals from the control unit 66, exhaust by the exhaust device 26, the opening and closing of the switch SW, the supply of power from the high-frequency power supply 32, the adjustment of an impedance by the matcher 34, the supply of power from the high-frequency power supply 35, the adjustment of an impedance by the matcher 36, the supply of a processing gas by the gas supply unit 44, and the supply of a heat transfer gas by the heat transfer gas supply unit 62 are controlled.

In the substrate processing apparatus 10, a processing gas is supplied from the gas supply unit 44 to the processing space S. In addition, a high-frequency electric field is formed between the electrode plate 40 and the susceptor 14, that is, in the processing space S. Thereby, plasma is generated in the processing space S, and a processing of the wafer W is performed by, for example, radicals of elements contained in the processing gas. In addition, the processing of the wafer W may be an arbitrary processing, for example, etching of the wafer W or film formation on the wafer W, but is not limited thereto.

In addition, the control unit 66 controls the plurality of drive units 72 so as to perform a substrate delivery processing to be described later. To give a detailed example, when the wafer W is transported to the stage ST by the transport arm, the control unit 66 causes the plurality of pins 70, which are provided on the stage ST to freely protrude or retreat, to protrude above the stage ST so as to receive the wafer W. Then, the control unit 66 detects the position of a predetermined portion of the wafer W in a state where the wafer W is supported by the plurality of pins 70. Then, the control unit 66 estimates the deviation amount and deviation direction of positional deviation between a center position of the wafer W and a predetermined reference position by using the detected result of the position of the predetermined portion of the wafer W. Then, the control unit 66 tilts the wafer W by individually moving each pin 70 to the height position of the pin 70 depending on the estimated deviation amount and deviation direction. Then, the control unit 66 brings the wafer W into partial contact with the stage ST by lowering the plurality of pins 70 at the same speed in a state in which the wafer W is tilted. Then, by causing the plurality of pins 70 to be continuously lowered, the control unit 66 disposes the wafer W on the stage ST while moving the center position of the wafer W by the deviation amount in a direction opposite to the deviation direction by using the rotational motion of the wafer W due to the contact with the stage ST.

Here, the position of the predetermined portion of the wafer W is, for example, the position of the edge portion of the wafer W. The position of the edge portion of the wafer W is detected by the detector 80, for example. In addition, the reference position is an imaginary center position of the wafer W in a case where the wafer W is normally disposed on the stage ST (i.e., in a case where the wafer W is disposed on the stage ST so that the center position of the wafer W coincides with the center position of the stage ST).

Figure 3:
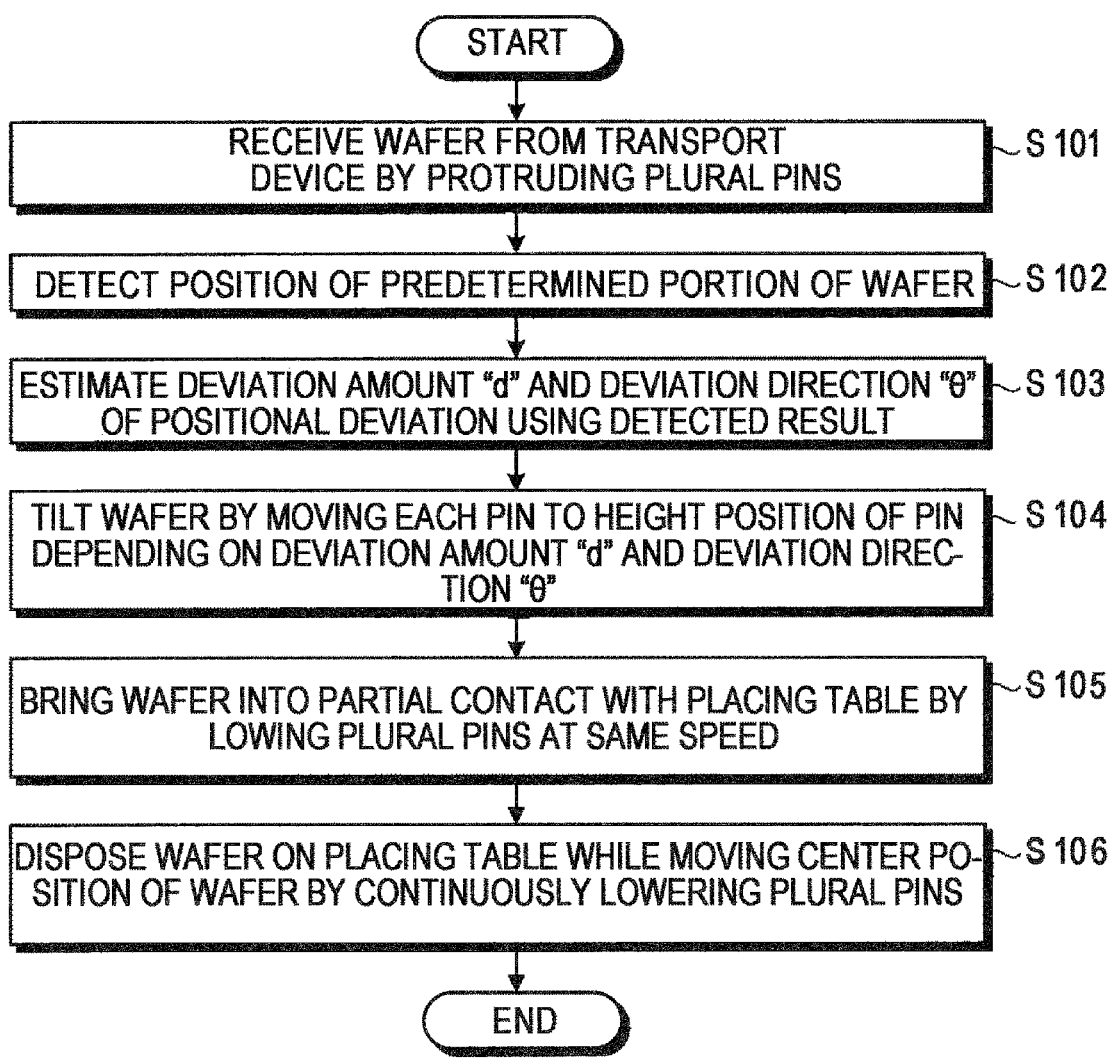
FIG. 3 is a flowchart illustrating an example of a flow of a substrate delivery processing according to an exemplary embodiment.

Next, a substrate delivery processing of the wafer W from the transport device according to an exemplary embodiment will be described. FIG. 3 is a flowchart illustrating an example of a flow of a substrate delivery processing according to an exemplary embodiment. FIGS. 4A to 4F are views for explaining an example of a flow of a substrate delivery processing according to the exemplary embodiment.

As illustrated in FIG. 3, when the wafer W is transported to the stage ST by the transport device (in this case, the transport arm), the control unit 66 of the substrate processing apparatus 10 causes the plurality of pins 70 to protrude from the stage ST so as to receive the wafer W from the transport arm (step S101). That is, as illustrated in FIG. 4A, the control unit 66 raises the plurality of pins 70 from the placing surface of the stage ST (i.e., the first region R1) in a vertical direction, thereby lifting the wafer W on the transport arm. Thereby, the wafer W is horizontally supported by the plurality of pins 70. Here, in general, before the wafer W is transported to the stage ST by the transport arm, positioning of the wafer W using an alignment device is performed so that a center position C of the wafer W coincides with a predetermined reference position O. However, when the positioned wafer W is transported to the stage ST by the transport arm, the center position C of the wafer W may deviate from the predetermined reference position O in a horizontal direction due to, for example, a vibration of the transport arm or repetition accuracy. In addition, in the exemplary embodiment, as illustrated in FIG. 4A, at a point in time when the wafer W is received from the transport arm by the plurality of pins 70, it is assumed that the center position C of the wafer W deviates from the reference position O, which corresponds to the center portion of the stage ST, in a horizontal direction.

Subsequently, in a state where the wafer W is supported by the plurality of pins 70, the control unit 66 detects the position of a predetermined portion of the wafer W using the detector 80 (step S102). That is, as illustrated in FIG. 4B, the control unit 66 emits a laser light from the light emitting element of the detector 80 to the edge portion of the wafer W, receives the reflected light of the laser light by the light receiving element of the detector 80, and detects the position of the edge portion of the wafer W based on the amount of the received reflected light.

Subsequently, the control unit 66 estimates a deviation amount "d" and a deviation direction "θ" of positional deviation between the center position C of the wafer W and the predetermined reference position O by using the detected result of the position of the edge portion of the wafer W (step S103). That is, as illustrated in FIG. 4C, the control unit 66 compares a position Wo of the edge portion of the wafer W in a case where the wafer W is normally disposed on the stage ST with an actually detected position We of the edge portion of the wafer W. Then, based on the comparison result between the position Wo and the position We, the control unit 66 estimates the deviation amount "d" and the deviation direction "θ" of the positional deviation between the center position C of the wafer W and the predetermined reference position O. In addition, as illustrated in FIG. 4C, the deviation direction "θ" corresponds to, for example, an angle with respect to a reference line that extends in a predetermined direction from the reference position O.

Figure 4D:
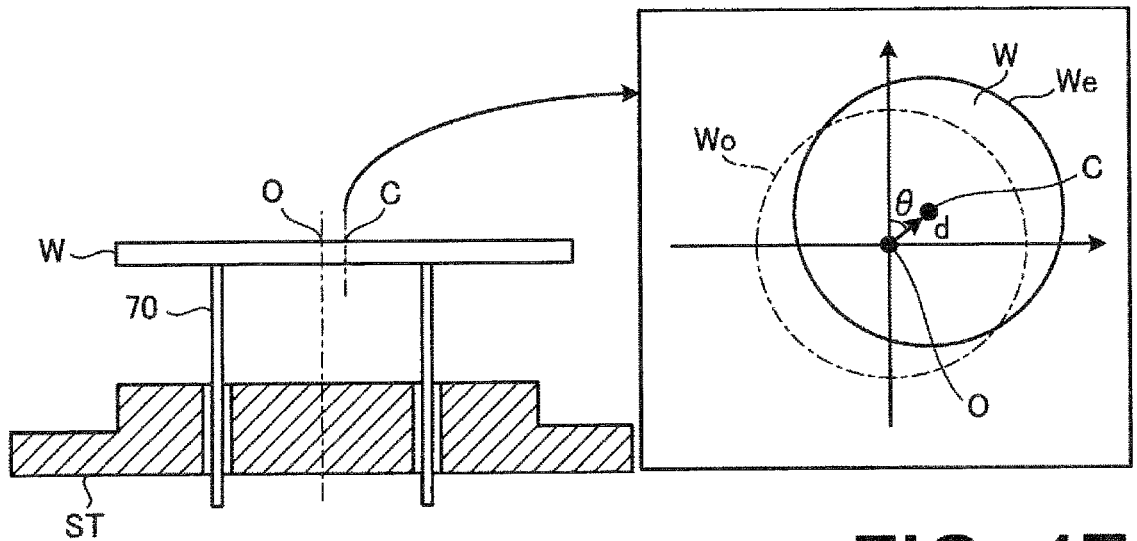
FIGS. 4D to 4F are views for explaining an example of a flow of a substrate delivery processing according to an exemplary embodiment.

Subsequently, the control unit 66 tilts the wafer W by individually moving each pin 70 to the height position of the pin 70 depending on the estimated deviation amount "d" and deviation direction "θ" (step S104). That is, as illustrated in FIG. 4D, the control unit 66 moves the pins 70 individually so as to tilt the wafer W in a state where a portion E of the edge portion of the wafer W, which intersects a straight line that extends from the reference position O and passes through the center position C of the wafer W, becomes lowest.

Here, a processing of tilting the wafer W by the control unit 66 will be described in more detail. The control unit 66 selects the height position of each pin 70 corresponding to a combination of the estimated deviation amount "d" and deviation direction "θ" with reference to a height position table illustrated in FIG. 5, and individually moves each pin 70 to the selected height position, thereby tilting the wafer W. The height position table illustrated in FIG. 5 is a table in which the height position of each pin 70 for tilting the wafer W is stored to be associated with each combination of the deviation amount and the deviation direction of the positional deviation between the center position C of the wafer and the predetermined reference position O, and is created in advance using, for example, a simulation and stored in the storage unit of the control unit 66. For example, when the combination (d, θ) of the deviation amount "d" and the deviation direction "θ" is (d1, θ1), (Pin #1, Pin #2, Pin #3)=(H1, H2, H3) is selected as the height position of each of three pins 70 (pin #1, pin #2, pin #3).

Figure 4E:
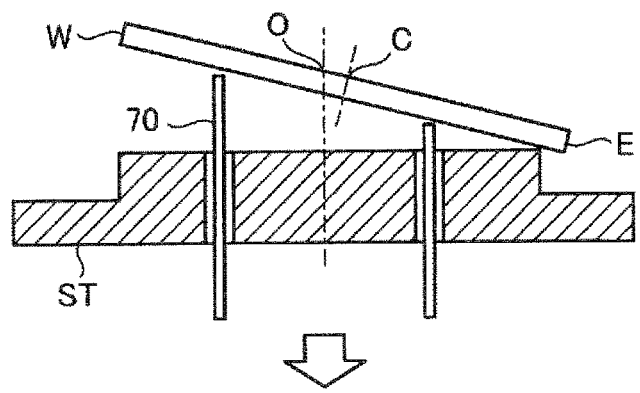

Returning to the description of FIG. 3, subsequently, the control unit 66 brings the wafer W into partial contact with the stage ST by lowering the plurality of pins 70 at the same speed in a state where the wafer W is tilted, (step S105). That is, as illustrated in FIG. 4E, the control unit 66 lowers the plurality of pins 70 at the same speed in a state where the wafer W is tilted, thereby causing a portion of the wafer W between the center position C and the above portion E to be brought into contact with the stage ST.

Figure 4F:
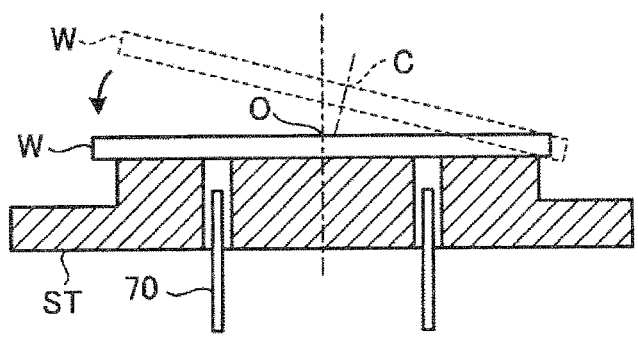

Subsequently, by continuously lowering the plurality of pins 70, the control unit 66 disposes the wafer W on the stage ST while moving the center position C of the wafer W by the deviation amount "d" in a direction opposite to the deviation direction "θ" by using rotation of the wafer W in a vertical direction due to the contact with the stage ST (step S106). That is, as illustrated in FIG. 4F, by continuously lowering the plurality of pins 70, the control unit 66 generates rotational motion in which the wafer W rotates in a direction approaching the placing surface of the stage ST about a contact point thereof with the stage ST, and based on the generated rotational motion, disposes the wafer W on the stage ST while moving the center position C of the wafer W by the deviation amount "d" in the direction opposite to the deviation direction "θ". Thereby, the wafer W is disposed on the stage ST in a state where the center position C of the wafer W coincides with the reference position O.

As described above, according to the exemplary embodiment, the wafer W is received from the transport arm by protruding the plurality of pins 70, which are provided to freely protrude from or retreat to the stage ST, on which the wafer W transported by the transport arm is disposed, a position of a predetermined portion of the wafer W is detected in a state where the wafer W is supported by the plurality of pins 70, a deviation amount and a deviation direction of positional deviation between a center position of the wafer W and a predetermined reference position is estimated by using a detected result of the position of the predetermined portion of the wafer W, the wafer W is tilted by individually moving each pin 70 to a height position of the pin 70 depending on the estimated deviation amount and deviation direction, the wafer W is brought into partial contact with the stage ST by lowering the plurality of pins 70 at a same speed in a state where the wafer W is tilted, and the wafer W is disposed on the stage ST while moving the center position of the wafer W by the deviation amount in a direction opposite to the deviation direction by using rotational motion of the wafer W due to contact with the stage ST by continuously lowering the plurality of pins 70. As a result, it is possible to appropriately correct the positional deviation of the center position of the wafer W disposed on the stage ST. For example, even when the center position of the wafer W deviates from the predetermined reference position in a horizontal direction due to, for example, a vibration of the transport arm, it is possible to appropriately correct the positional deviation of the center position of the wafer W disposed on the stage ST.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate delivery method comprising:
receiving a substrate from a transport device by protruding a plurality of pins, which are provided to freely protrude from or retreat to a placing table, on which the substrate transported by the transport device is disposed, above the placing table;
detecting a position of a predetermined portion of the substrate in a state where the substrate is supported by the plurality of pins;
estimating a deviation amount and a deviation direction of a positional deviation between a center position of the substrate and a predetermined reference position using a detected result of the position of the predetermined portion of the substrate;
tilting the substrate by individually moving each pin to a height position of the pin depending on the estimated deviation amount and deviation direction; and
bringing a portion of the substrate into contact with the placing table by lowering the plurality of pins at a same speed in a state where the substrate is tilted; and
disposing the substrate on the placing table while moving the center position of the substrate by the deviation amount in a direction opposite to the deviation direction using rotation of the substrate in a vertical direction according to contact with the placing table by continuously lowering the plurality of pins.

2. The substrate delivery method of claim 1, wherein the tilting includes selecting the height position of each pin corresponding to a combination of the estimated deviation amount and deviation direction with reference to a table in which the height position of each pin for tilting the substrate is stored to be associated with each combination of the deviation amount and the deviation direction of the positional deviation between the center position of the substrate and the predetermined reference position, and individually moving each pin to the selected height position so as to tilt the substrate.

3. The substrate delivery method of claim 1, wherein the tilting includes individually moving each pin so as to tilt the substrate in a state where a portion of an edge portion of the substrate, which intersects a straight line that extends from the reference position and passes through the center position of the substrate, becomes lowest.

4. A substrate processing apparatus comprising:
a processing container;
a placing table provided in the processing container, on which a substrate transported by a transport device is disposed;
a plurality of pins provided to freely protrude from or retreat to the placing table;
a detector configured to detect a position of a predetermined portion of the substrate; and
a control unit configured to execute the substrate delivery method of claim 1.

\* \* \* \* \*